(12) United States Patent
Honda et al.

(10) Patent No.: US 7,895,970 B2
(45) Date of Patent: Mar. 1, 2011

(54) STRUCTURE FOR PLASMA PROCESSING CHAMBER, PLASMA PROCESSING CHAMBER, PLASMA PROCESSING APPARATUS, AND PLASMA PROCESSING CHAMBER COMPONENT

(75) Inventors: Masanobu Honda, Nirasaki (JP); Toshihiro Hayami, Nirasaki (JP); Yutaka Matsui, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 295 days.

(21) Appl. No.: 11/529,372

(22) Filed: Sep. 29, 2006

(65) Prior Publication Data
US 2007/0068798 A1 Mar. 29, 2007

Related U.S. Application Data

(60) Provisional application No. 60/777,540, filed on Mar. 1, 2006, provisional application No. 60/731,280, filed on Oct. 31, 2005.

(30) Foreign Application Priority Data

Sep. 29, 2005 (JP) ............................. 2005-285247
Feb. 6, 2006 (JP) ............................. 2006-028982

(51) Int. Cl.
C23C 16/00 (2006.01)
C23F 1/00 (2006.01)
H01L 21/306 (2006.01)

(52) U.S. Cl. .............................. 118/723 E; 156/345.47
(58) Field of Classification Search ................ 118/723, 118/723 E; 156/345.47
See application file for complete search history.

(56) References Cited

U.S. PATENT DOCUMENTS 6,173,673 B1 * 1/2001 Golovato et al. ......... 118/723 E (Continued)

FOREIGN PATENT DOCUMENTS

JP 10-275694 10/1998

(Continued)

OTHER PUBLICATIONS

Japanese Office Action with English translation dated Sep. 28, 2010 in Japanese Patent Application No. 2006-028982, 6 pages.

Primary Examiner—Parviz Hassanzadeh
Assistant Examiner—Keath T Chen
(74) Attorney, Agent, or Firm—Oblon, Spivak, McClelland, Maier & Neustadt, L.L.P.

(57) ABSTRACT

A structure for a plasma processing chamber which makes it possible to control the potential therein and simplify the construction of the plasma processing chamber. A gas-introducing showerhead 34 is disposed in the plasma processing chamber 10 including a container 11 having a process space S for receiving a semiconductor wafer W, and a susceptor 12 disposed in the container 11, for mounting the received semiconductor wafer W thereon. The susceptor 12 is connected to high-frequency power supplies 20 and 46. An electrode support 39 of the gas-introducing showerhead 34 is electrically grounded. An electrically floating top electrode plate 38 of the gas-introducing showerhead 34 is disposed between the electrode support 39 and the process space S. The top electrode plate 38 has a surface exposed to the process space S. An insulating film 48 is formed of a dielectric material and disposed between the electrode support 39 and the top electrode plate 38.

12 Claims, 6 Drawing Sheets

U.S. PATENT DOCUMENTS

| | | | |
|---|---|---|---|
| 6,228,438 B1* | 5/2001 | Schmitt | 427/569 |
| 6,616,767 B2* | 9/2003 | Zhao et al. | 219/121.52 |
| 6,786,175 B2* | 9/2004 | Dhindsa et al. | 118/723 E |
| 7,104,217 B2* | 9/2006 | Himori et al. | 118/723 E |
| 2001/0022293 A1* | 9/2001 | Maeda et al. | 216/67 |
| 2003/0011960 A1* | 1/2003 | Koning et al. | 361/311 |
| 2005/0028935 A1* | 2/2005 | Wickramanayaka et al. | 156/345.34 |

FOREIGN PATENT DOCUMENTS

| | | |
|---|---|---|
| JP | 11/176821 | 7/1999 |
| JP | 2004-158247 | 6/2004 |
| JP | 2005-072347 | 3/2005 |

\* cited by examiner

STRUCTURE FOR PLASMA PROCESSING CHAMBER, PLASMA PROCESSING CHAMBER, PLASMA PROCESSING APPARATUS, AND PLASMA PROCESSING CHAMBER COMPONENT

BACKGROUND OF THE INVENTION

1. Field of the Invention

The present invention relates to a structure for a plasma processing chamber, a plasma processing chamber, a plasma processing apparatus, and a plasma processing chamber component, and more particularly to a structure for a plasma processing chamber and a plasma processing chamber component, which are exposed to plasma.

2. Description of the Related Art

Conventionally, there has been proposed a plasma processing chamber provided with a hollow cylindrical container, and electrodes that are disposed in the container and are connected to high-frequency power supplies, respectively. In the plasma processing chamber, a process gas is introduced into the container, and electrodes apply high-frequency power to a space within the container. Further, when a semiconductor wafer as a substrate is received in the container, the introduced process gas is turned into a plasma by the high-frequency power to generate ions and the like, whereby the semiconductor wafer is subjected to plasma processing, such as etching, by the ions and the like.

When a reactive gas, such as a mixed gas comprised of a $C_4F_8$ gas and an argon (Ar) gas, is used as a process gas, depositable active species (radicals) generated from the reactive gas are deposited as polymer on the inner sidewall (hereinafter simply referred to as "the sidewall") of the container. If the amount of deposited polymer is too large, the polymer can be exfoliated from the sidewall when plasma processing is performed on the semiconductor wafer to be attached to the surface thereof as deposits, and hence it is required to remove the polymer deposited on the sidewall.

It is preferred that the polymer deposited on the sidewall is removed by causing positive ions generated when the process gas is turned into the plasma, to collide against the sidewall. The number of times of collision of positive ions against the sidewall depends on the potential of the sidewall. More specifically, when the potential of the sidewall is low, and hence the potential difference between the sidewall and the plasma generated from the process gas in the space within the processing chamber is large, the number of times of collision of positive ions against the sidewall increases to remove the deposited polymer.

However, in a type of processing in which depositable active species are not generated (i.e. deposition-free processing), such as a process in which an $O_2$ gas is used as a process gas, when the potential difference between the sidewall and the plasma is too large, the number of times of collision of positive ions against the sidewall becomes so large as to sometimes shave not only the deposited polymer but also the sidewall. Therefore, it is required to control the potential of the sidewall, to thereby appropriately adjust the number of times of collision of positive ions against the sidewall.

As a technique of controlling the potential of the sidewall of the plasma processing chamber, a method is known in which the anode/cathode ratio of the container in the plasma processing chamber is adjusted. The anode/cathode ratio of the container varies with the distance (gap) between an upper electrode and a lower electrode disposed in the container and the position of an exhaust plate disposed in the same. Therefore, in order to adjust the anode/cathode ratio, it is required to change the gap and/or the position of the exhaust plate, which can hinder the distribution of plasma density and the like in the container from being set preferably for etching.

To overcome the problem, as a technique of controlling the potential of the sidewall of the plasma processing chamber without adjusting the anode/cathode ratio of the container, it has been proposed to dispose a potential control circuit provided with an impedance adjusting means, such as variable capacitors and coils, between the sidewall and a ground potential, and control the potential of the sidewall by adjusting the impedance of the potential control circuit (see e.g. Japanese Laid-Open Patent Publication (Kokai) Nos. H10-275694 and H11-176821).

Further, since polymer is sometimes deposited not only on the sidewall but also on the surfaces of the electrodes, or the electrodes are sometimes shaved by positive ions, it is preferable to dispose a potential control circuit provided with an impedance adjusting means between the electrodes and the ground potential, thereby controlling the potential of the electrodes.

According to the above-described technique of controlling the potential, however, the potential control circuit provided with the impedance adjusting means is required, which makes the construction of the plasma processing chamber complicated. This also causes an increase in manufacturing costs of the plasma processing chamber.

Further, the above described technique is only capable of controlling the potential of the sidewall uniformly. However, the amount of deposition of polymer is not uniform throughout the plasma processing chamber, which makes it impossible to properly remove the polymer.

SUMMARY OF THE INVENTION

It is a first object of the present invention to provide a structure for a plasma processing chamber, which makes it possible to control the potential (electric potential) therein and simplify the construction of the plasma processing chamber, a plasma processing chamber including the structure for a plasma processing chamber, and a plasma processing apparatus having the plasma processing chamber.

It is a second object of the present invention to provide a plasma processing chamber component which makes it possible to control the potential thereof and properly remove deposits therefrom.

To attain the above first object, in a first aspect of the present invention, there is provided a structure for a plasma processing chamber including a container having a space for receiving a substrate, and a mounting stage disposed in the container, for mounting the received substrate thereon, the mounting stage being connected to at least one high-frequency power supply, the structure being disposed in the plasma processing chamber and comprising a first conductive member that is electrically grounded, a second conductive member that is disposed between the first conductive member and the space and is electrically floating, the second conductive member having a surface exposed to the space, and at least one insulating member that is formed of a dielectric material and is disposed between the first conductive member and the second conductive member.

With the arrangement of the first aspect of the present invention, the structure for a plasma processing chamber is comprised of a first conductive member that is electrically grounded, a second conductive member that is disposed between the first conductive member and the space and is electrically floating, the second conductive member having a surface exposed to the space, and at least one insulating member that is formed of a dielectric material and is disposed between the first conductive member and the second conductive member. The structure comprised of the two conductive members and the insulating member disposed between the two conductive members has a predetermined electric capacity. In this structure, the potential of the first conductive member is fixed to a ground potential. When high-frequency power is applied to the space in the container to generate plasma, a sheath as a region with very few electrons is formed in the vicinity of the structure. Further, the structure has an impedance ((capacitive) reactance) corresponding to its electric capacity. As an AC current corresponding to the high-frequency power passes through the sheath and the structure, voltage drop occurs from the space to ground potential, and the voltage drop is shared by the sheath and the structure. The sharing ratio of the voltage drop between the sheath and the structure varies with the magnitude of the (capacitive) reactance of the structure. Further, a potential corresponding to part of the voltage drop occurring across the structure is generated on the surface of the second conductive member exposed to the space. Therefore, it is possible to control the potential of the structure by controlling the magnitude of the electric capacity of the structure without using a potential control circuit. This makes it possible not only to control the potential of the structure, but also to simplify the construction of the plasma processing chamber.

Preferably, the second conductive member is connected to a DC power supply.

With the arrangement of this preferred embodiment, the second conductive member is connected to the DC power supply. In the case where the DC power supply is connected to the conductive member to supply DC power to the same, a matcher conventionally required in supplying high-frequency power can be dispensed with. Further, it is possible to maintain a state of only ions being drawn to the structure but electrons being not, which makes it possible to prevent the number of electrons from decreasing in the space within the container. This makes it possible to further simplify the construction of the plasma processing chamber and enhance the efficiency of plasma processing.

Preferably, the structure has an electric capacity of not smaller than 1000 pF.

With the arrangement of this preferred embodiment, since the electric capacity of the structure is not smaller than 1000 pF, it is possible to reduce the (capacitive) reactance of the structure, thereby reducing the part of the voltage drop occurring across the structure. Thus, a potential generated on the surface of the second conductive member exposed to the space can be lowered, which enables efficient removal of polymer deposited on the structure.

Preferably, the structure has an electric capacity of not smaller than 50000 pF.

With the arrangement of this preferred embodiment, since the electric capacity of the structure is not smaller than 50000 pF, it is possible to further reduce the (capacitive) reactance of the structure.

Preferably, the insulating member is formed of at least one material selected from the group consisting of metal oxides and metal nitrides.

With the arrangement of this preferred embodiment, since the at least one insulating member is formed of at least one material selected from the group consisting of metal oxides and metal nitrides, it is possible to enhance the efficiency of heat transfer between the first conductive member and the second conductive member, thereby easily controlling the temperature of the structure.

Preferably, the insulating member is formed of an organosilicon compound.

With the arrangement of this preferred embodiment, since the at least one insulating member is formed of an organosilicon compound, it is possible to attain high heat conductivity and high insulation at the same time.

Preferably, the insulating member is formed of an organic substance.

With the arrangement of this preferred embodiment, since the at least one insulating member is formed of an organic substance, it is possible not only to secure high insulation, but also to easily increase the electric capacity of the structure.

Preferably, the insulating member has a thickness varying with location.

With the arrangement of this preferred embodiment, the at least one insulating member has a thickness varying with location. Therefore, it is possible to change a potential generated on each portion of the at least one insulating member according to the amount of polymer to be deposited on the portion, thereby providing control such that the amounts of polymer deposited on the respective portions become uniform.

Preferably, the insulating member has a thickness that progressively decreases toward a central part of the container.

With the arrangement of this preferred embodiment, the at least one insulating member has a thickness progressively reduced toward the central part of the container. When the thickness of the insulating member is set to be smaller, the electric capacity thereof becomes larger, which makes the (capacitive) reactance smaller, so that the part of the voltage drop occurring across the structure is reduced. Further, the amount of polymer generated in plasma processing sometimes progressively increases toward the central part of the container. In such a case, it is possible to easily generate a proper potential on the surface of the second conductive member exposed to the space, according to the amount of generation of polymer.

Preferably, the insulating member has portions thereof formed of respective different materials.

With the arrangement of this preferred embodiment, the at least one insulating member has portions formed of respective different materials. Therefore, it is possible to change the potential generated on each portion according to the amount of polymer to be deposited on the portion, thereby providing control such that the amounts of polymer deposited on the respective portions become uniform.

Preferably, the materials forming the insulating member are arranged such that a relative dielectric constant of the insulating member progressively increases toward a central part of the container.

With the arrangement of this preferred embodiment, the materials forming the at least one insulating member are arranged such that the relative dielectric constant of the at least one insulating member progressively increases toward the central part of the container. As the relative dielectric constant of the insulating member is larger, the electric capacity thereof becomes larger, which makes the (capacitive) reactance smaller, so that the part of the voltage drop occurring across the structure is reduced. Further, the amount of polymer generated in plasma processing sometimes increases toward the central part of the container. In such a case, it is possible to easily generate a proper potential on the surface of the second conductive member exposed to the space, according to the amount of generation of polymer.

To attain the first object, in a second aspect of the present invention, there is provided a structure for a plasma processing chamber including a container having a space for receiving a substrate, and a mounting stage disposed in the container, for mounting the received substrate thereon, the mounting stage being connected to at least one high-frequency power supply, the structure being disposed in the plasma processing chamber and comprising a first conductive member that is electrically grounded, a second conductive member that is disposed between the first conductive member and the space and is electrically floating, the second conductive member having a surface exposed to the space, and a vacuum layer provided between the first conductive member and the second conductive member.

With the arrangement of the second aspect of the present invention, the structure for a plasma processing chamber is comprised of a first conductive member that is electrically grounded, a second conductive member that is disposed between the first conductive member and the space and is electrically floating, the second conductive member having a surface exposed to the space, and a vacuum layer provided between the first conductive member and the second conductive member. The structure comprised of the two conductive members and the vacuum layer disposed between the two conductive members has a predetermined electric capacity. In this structure, the potential of the first conductive member is fixed to a ground potential. When high-frequency power is applied to the space in the container to generate plasma, a sheath as a region with very few electrons is formed in the vicinity of the structure. Further, the structure has an impedance ((capacitive) reactance) corresponding to its electric capacity. As an AC current corresponding to the high-frequency power passes through the sheath and the structure, voltage drop occurs from the space to ground potential, and the voltage drop is shared by the sheath and the structure. The sharing ratio of the voltage drop between the sheath and the structure varies with the magnitude of the (capacitive) reactance of the structure. Further, a potential corresponding to part of the voltage drop occurring across the structure generates on the surface of the second conductive member exposed to the space. Therefore, it is possible to control the potential of the structure by controlling the magnitude of the electric capacity of the structure without using a potential control circuit. This makes it possible not only to control the potential of the structure, but also to simplify the construction of the plasma processing chamber.

To attain the first object, in a third aspect of the present invention, there is provided a plasma processing chamber including a container having a space for receiving a substrate, and a mounting stage disposed in the container, for mounting the received substrate thereon, the mounting stage being connected to at least one high-frequency power supply, comprising a first conductive member that is electrically grounded, a second conductive member that is disposed between the first conductive member and the space and is electrically floating, the second conductive member having a surface exposed to the space, and at least one insulating member that is formed of a dielectric material and is disposed between the first conductive member and the second conductive member.

To attain the above first object, in a fourth aspect of the present invention, there is provided a plasma processing apparatus comprising a plasma processing chamber including a container having a space for receiving a substrate, and a mounting stage disposed in the container therein, for mounting the received substrate thereon, the mounting stage being connected to at least one high-frequency power supply, wherein the plasma processing chamber comprises a first conductive member that is electrically grounded, a second conductive member that is disposed between the first conductive member and the space and is electrically floating, the second conductive member having a surface exposed to the space, and at least one insulating member that is formed of a dielectric material and is disposed between the first conductive member and the second conductive member.

To attain the second object, in a fifth aspect of the present invention, there is provided a plasma processing chamber component which is disposed in a plasma processing chamber including a container having a space for receiving a substrate, and a mounting stage disposed in the container, for mounting the received substrate thereon, the mounting stage being connected to at least one high-frequency power supply, comprising a conductive part that is electrically grounded, and an insulating part that covers the conductive part and faces the space, wherein a thickness of the insulating part is set according to an amount of deposits to be deposited on a surface of the insulating part facing the space.

With the arrangement of the fifth aspect of the present invention, the plasma processing chamber component is comprised of a conductive part that is electrically grounded, and an insulating part that covers the conductive part and faces the space, and the thickness of the insulating part is set according to the amount of deposits to be deposited on a surface of the insulating part facing the space. The component including the insulating part covering the electrically grounded conductive part and facing the space has a predetermined electric capacity. In this component, the potential of the conductive part is fixed to a ground potential. When high-frequency power is applied to the space in the container to generate plasma, a sheath as a region with very few electrons is formed in the vicinity of the component. Further, the component has an impedance ((capacitive) reactance) corresponding to its electric capacity. As an AC current corresponding to the high-frequency power passes through the sheath and the component, voltage drop occurs from the space to ground potential, and the voltage drop is shared by the sheath and the component. The sharing ratio of the voltage drop between the sheath and the component varies with the magnitude of the (capacitive) reactance of the component. Further, a potential corresponding to part of the voltage drop occurring across the component is generated on the surface of the insulating part. Therefore, it is possible to control the potential of the component by controlling the magnitude of the electric capacity of the component without using a potential control circuit. Further, when the thickness of the insulating part is changed, the electric capacity of the component changes to change the reactance of the same, so that the potential generated on the surface of the insulating part is also changed. Therefore, by setting the thickness of the insulating part according to the amount of deposits to be formed on the surface of the insulting part, it is possible to set the potential of the surface to a value corresponding to the amount of deposits to be removed from the surface, thereby achieving proper removal of the deposits.

Preferably, a thickness of a portion of the insulating part on which a larger amount of deposits is to be deposited is smaller than a thickness of a portion of the insulating part on which a smaller amount of deposits is to be deposited.

With the arrangement of this preferred embodiment, the thickness of a portion of the insulating part on which a larger amount of deposits is to be deposited is smaller than the thickness of a portion of the insulating part on which a smaller amount of deposits is to be deposited. As the thickness of the insulating part is set to be smaller, the (capacitive) reactance of the component becomes smaller, which reduces the part of the voltage drop occurring across the component. Therefore, as the thickness of the insulating part is set to be smaller, the potential difference between the space to which high-frequency power is applied and the insulating part of the component can be increased, which makes it possible to remove a larger amount of deposits. As a result, this makes it possible to properly remove the deposits according to the amount thereof.

Preferably, the insulating part is formed of a sprayed metal oxide film or a sprayed metal nitride film.

With the arrangement of this preferred embodiment, the insulating part is formed of a sprayed metal oxide film or a sprayed metal nitride film. Therefore, the thickness of the insulating part can easily be set to a desired value, which facilitates removal of deposits.

Alternatively, the insulating part is formed by an insulating plate member.

With the arrangement of this preferred embodiment, the insulating part is formed by an insulating plate member. This makes it possible to simplify the construction of the component, and thereby simplify the construction of the plasma processing chamber.

To attain the second object, in a sixth aspect of the present invention, there is provided a plasma processing chamber including a container having a space for receiving a substrate, and a mounting stage disposed in the container, for mounting the received substrate thereon, the mounting stage being connected to at least one high-frequency power supply, comprising a conductive part that is electrically grounded, and an insulating part that covers the conductive part and faces the space, wherein a thickness of the insulating part is set according to an amount of deposits to be deposited on a surface of the insulating part facing the space.

To attain the second object, in a seventh aspect of the present invention, there is provided a plasma processing apparatus comprising a plasma processing chamber including a container having a space for receiving a substrate, and a mounting stage disposed in the container, for mounting the received substrate thereon, the mounting stage being connected to at least one high-frequency power supply, wherein the plasma processing chamber comprises a conductive part that is electrically grounded, and an insulating part that covers the conductive part and faces the space, wherein a thickness of the insulating part is set according to an amount of deposits to be deposited on a surface of the insulating part facing the space.

The above and other objects, features, and advantages of the invention will become more apparent from the following detailed description taken in conjunction with the accompanying drawings.

BRIEF DESCRIPTION OF THE DRAWINGS

FIGS. 5A and 5B are schematic views of a plasma processing chamber component according to a third embodiment of the present invention, in which: FIG. 5A is a view showing the positional relationship between a sheath and the component; and FIG. 5B is a circuit diagram schematically showing the sheath and the component as an electric circuit; and FIGS. 6A and 6B are graphs showing changes in the potential of a yttria coating as a sprayed coating on the plasma processing chamber component, which occur when the thickness of the yttria coating and the magnitude of high-frequency power are changed, in which: FIG. 6A shows a case where a high-frequency power of 27 MHz is applied to a process space; and FIG. 6B shows a case where a high-frequency power of 3 MHz is applied to the process space.

DETAILED DESCRIPTION OF THE PREFERRED EMBODIMENTS

The present invention will now be described in detail with reference to the drawings showing preferred embodiments thereof.

First, a description will be given of a plasma processing chamber provided with a structure for a plasma processing chamber, according to a first embodiment of the present invention.

Figure 1:
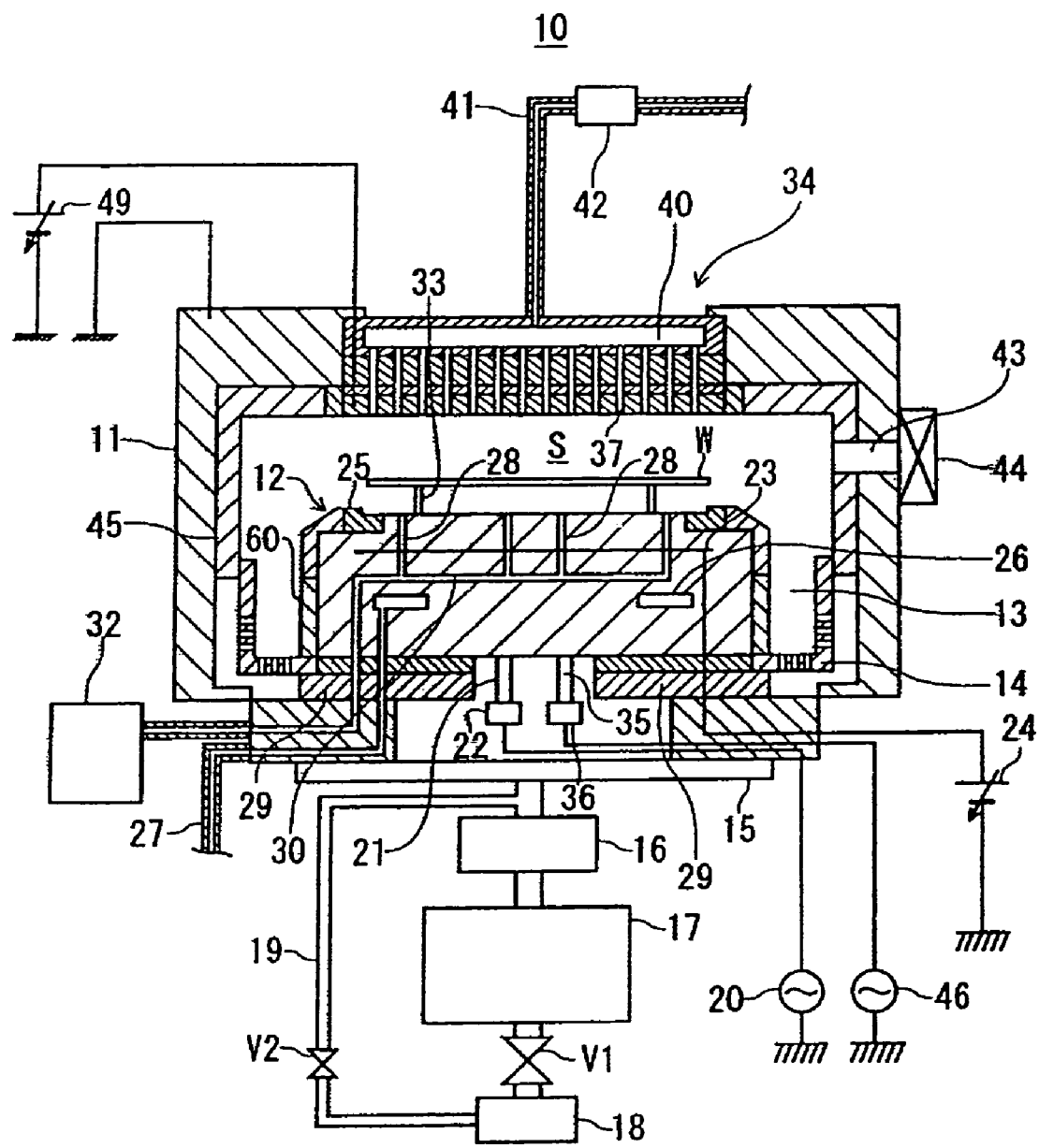
FIG. 1 is a schematic cross-sectional view of a plasma processing chamber provided with a structure for a plasma processing chamber, according to a first embodiment of the present invention.

FIG. 1 is a schematic cross-sectional view of the plasma processing chamber provided with the structure for the plasma processing chamber, according to the first embodiment. The plasma processing chamber is configured to be capable of carrying out RIE (Reactive Ion Etching) or ashing on a semiconductor wafer W as a substrate. This plasma processing chamber is applied to a substrate processing apparatus (plasma processing apparatus) and the like.

Referring to FIG. 1, the plasma processing chamber 10 has a hollow cylindrical container 11 having a process space S defined therein. Disposed in the container 11 is a cylindrical susceptor 12 as a mounting stage on which is placed a semiconductor wafer W (hereinafter simply referred to as "the wafer W") having a diameter of e.g. 300 mm. The container 11 has an inner wall surface thereof covered by a container sidewall member 45. The container sidewall member 45 is formed of aluminum, and a surface thereof facing the process space S is coated with yttria ($Y_2O_3$). The container 11 is electrically grounded. The susceptor 12 is disposed on a bottom part of the container 11 via an insulating member 29. The susceptor 12 has a side surface thereof covered by a susceptor side surface-covering member 60.

The plasma processing chamber 10 has an exhaust passage 13 defined therein between the inner sidewall of the container 11 and the side surface of the susceptor 12. The exhaust passage 13 functions as a flow path for discharging gas molecules above the susceptor 12 out of the container 11. Disposed in an intermediate portion of the exhaust passage 13 is an annular exhaust plate 14 for preventing leakage of plasma. A space downstream of the exhaust plate 14 in the exhaust passage 13 extends round downward to a space below the susceptor 12 to communicate with an adaptive pressure control valve (hereinafter referred to as "the APC valve") 15 implemented by a variable butterfly valve. The APC valve 15 is connected, via an isolator 16, to a turbo molecular pump (hereinafter referred to as "the TMP") 17 as a vacuum pump for drawing a vacuum, and the TMP 17 is connected to a dry pump (hereinafter referred to as "the DP") 18 as a vacuum pump via a valve V1. An evacuation flow path formed by the APC valve 15, the isolator 16, the TMP 17, the valve V1, and the DP 18 is used not only for controlling pressure within the container 11 using the APC valve 15, but also for decompressing the inside of the container 11 substantially to a vacuum using the TMP 17 and the DP 18.

Further, a pipe 19 extends from an intermediate portion of a pipe connecting between the isolator 16 and the APC valve 15, and is connected to the DP 18 via a valve V2. The pipe 19 and the valve V2 bypass the TMP 17 to roughly evacuate the inside of the container 11 using the DP 18.

A high-frequency power supply 20 is connected to the susceptor 12 via a power supply rod 21 and a matcher 22. The high-frequency power supply 20 supplies a high-frequency power of e.g. 40 MHz to the susceptor 12, whereby the susceptor 12 functions as a lower electrode. The matcher 22 reduces the reflection of the high-frequency power from the susceptor 12 to thereby maximize the efficiency of supply of the high-frequency power to the susceptor 12. The susceptor 12 applies a high-frequency power having a relatively high frequency of e.g. 40 MHz supplied from the high-frequency power supply 20 to the process space S. At this time, a potential is generated in the process space S by the high-frequency power applied thereto.

Further, another high-frequency power supply 46 is connected to the susceptor 12 via a power supply rod 35 and a matcher 36. The high-frequency power supply 46 supplies a high-frequency power having a relatively low frequency of e.g. 2 MHz to the susceptor 12. The matcher 36 has the same function as that of the matcher 22.

The supplied high-frequency power of 2 MHz generates a potential of a high frequency (2 MHZ) in the susceptor 12, particularly on the surface of the same. Further, the supplied high-frequency power of 40 MHz also generates a potential on the surface of the susceptor 12.

Therefore, since the potentials are generated in the process space S and on the susceptor 12, some of positive ions generated in the process space S, i.e. positive ions of a number corresponding to the difference between the potential of the process space S and that of the susceptor 12 collide against the surface of the susceptor 12. The positive ions having collided against the surface of the susceptor 12 remove polymer deposited on the surface of the susceptor 12, by impact forces and the like.

At an upper location inside the susceptor 12, there is disposed a disk-shaped ESC electrode plate 23 formed of conductive films. An ESC DC power supply 24 is electrically connected to the ESC electrode plate 23. The wafer W is attracted and held on an upper surface of the susceptor 12 by a Coulomb's force or a Johnson-Rahbek force generated by a DC voltage applied to the ESC electrode plate 23 from the ESC DC power supply 24. At an upper location of the susceptor 12, an annular focus ring 25 is disposed in a manner surrounding the wafer W attracted and held on the upper surface of the susceptor 12. This focus ring 25 is exposed to the process space S, and focuses plasma generated in the process space S toward the surface of the wafer W to thereby enhance the efficiency of RIE or ashing.

Inside the susceptor 12 is formed an annular refrigerant chamber 26 extending e.g. along the circumference of the susceptor 12. A coolant, such as cooling water or Galden (registered trademark) at a predetermined temperature is supplied for circulation to the refrigerant chamber 26 from a chiller unit, not shown, through a refrigerant pipe 27. The processing temperature of the wafer W attracted and held on the upper surface of the susceptor 12 is controlled by the temperature of the coolant.

A plurality of heat transfer gas supply holes 28 are formed to open in a part (hereinafter referred to as the "holding surface") of the upper surface of the susceptor 12 where the wafer W is held by attraction. The heat transfer gas supply holes 28 are in communication with a heat transfer gas supply section 32 via a heat transfer gas supply line 30 formed through the susceptor 12. The heat transfer gas supply section 32 feeds helium gas as a heat transfer gas into a gap between the holding surface and a rear surface of the wafer W through the heat transfer gas supply holes 28.

Further, a plurality of pusher pins 33 are disposed on the holding surface of the susceptor 12, as lift pins that can be protruded from the upper surface of the susceptor 12. The pusher pins 33 are connected to a motor, not shown, via respective ball screws such that they are protruded from the holding surface by rotation of the motor which is converted by the ball screw into linear movement. When the wafer W is attracted and held on the holding surface so as to be subjected to RIE or ashing, the pusher pins 33 are withdrawn into the susceptor 12. Then, when the wafer W having been subjected to RIE or ashing is conveyed from the container 11, the pusher pins 33 are protruded from the upper surface of the susceptor 12 to separate the wafer W from the susceptor 12 and lift the same upward.

A gas-introducing showerhead 34 is disposed in a ceiling portion of the container 11 in a manner opposed to the susceptor 12. Formed in the gas-introducing showerhead 34 is a buffer chamber 40, and process gas supply piping 41 extending from a process gas supply unit (not shown) is connected to the buffer chamber 40. In an intermediate portion of the process gas supply piping 41, there is provided a pipe insulator 42. Further, the gas-introducing showerhead 34 is formed with a plurality of gas holes 37 for communication between the buffer chamber 40 and the process space S. The gas-introducing showerhead 34 feeds the process gas supplied to the buffer chamber 40 through the process gas supply piping 41 into the container 11 via the gas holes 37.

Further, the sidewall of the container 11 has a wafer inlet/outlet port 43 formed at a location corresponding to a height at which the wafer W lifted up from the susceptor 12 by the pusher pins 33 is positioned. A gate valve 44 is mounted at the wafer inlet/outlet port 43, for opening and closing the wafer inlet/outlet port 43.

As mentioned hereinabove, inside the container 11 of the plasma processing chamber 10, high-frequency power is applied by the susceptor 12 to the process space S between the susceptor 12 and a top electrode plate 38, described hereinafter, provided in the gas-introducing showerhead 34, whereby the process gas supplied from the gas-introducing showerhead 34 is turned into high-density plasma to produce positive ions and radicals. RIE or ashing is carried out on the wafer W using the positive ions and the radicals.

More specifically, in carrying out RIE or ashing on the wafer W in the plasma processing chamber 10, first, the gate valve 44 is opened, and the wafer W to be processed is conveyed into the container 11. Then, DC voltage is applied to the ESC electrode plate 23, whereby the wafer W conveyed into the container 11 is attracted and held on the holding surface of the susceptor 12. Further, gases of the process gas are introduced into the container 11 through the gas-introducing showerhead 34 at a predetermined flow rate and a predetermined flow rate ratio, and the pressure inside the container 11 is controlled to a predetermined value using the APC valve 15 and the like. Then, the high-frequency power is applied to the process space S by the susceptor 12, and at the same time the DC power is applied to the process space S by the top electrode plate 38. This turns the process gas introduced by the gas-introducing showerhead 34 into plasma in the process space S, and the plasma is focused onto the surface of the wafer W by the focus ring 25 to thereby physically or chemically etch the surface of the wafer W.

The above described operation of each component of the plasma processing chamber 10 is controlled by a CPU of a control section, not shown, provided for the plasma processing chamber 10, based on a program associated with a RIE or ashing process.

By the way, it is required to control the potential of the top electrode plate 38 so as to properly remove polymer deposited on the top electrode plate 38 by properly adjusting the number of times of collision of positive ions against the top electrode plate 38 in the container 11 similarly to the above-described case of removing polymer deposited on the sidewall.

In general, a structure comprised of an electrically grounded conductive member, an electrically floating conductive member facing a space to which high-frequency power is applied, and a dielectric member sandwiched by the two conductive members has a predetermined electric capacity. When plasma is generated in the space which the electrically floating conductive member faces, a sheath is formed in the vicinity of the structure. Further, the structure has an impedance ((capacitive) reactance) corresponding to its electric capacity. When an AC current corresponding to a high-frequency power passes through the sheath and the structure, voltage drop occurs from the space to ground potential, and the voltage drop is shared by the sheath and the structure. The sharing ratio of the voltage drop between the sheath and the structure varies with the magnitude of the (capacitive) reactance of the structure. Further, a potential corresponding to part of the voltage drop occurring across the structure is generated on a surface of the electrically floating conductive member exposed to the space.

The gas-introducing showerhead 34 as the structure for a plasma processing chamber, according to the present embodiment, is configured, described below, to control the potential of the top electrode plate 38, by making use of the above-described principles of generation of potentials.

Figure 2:
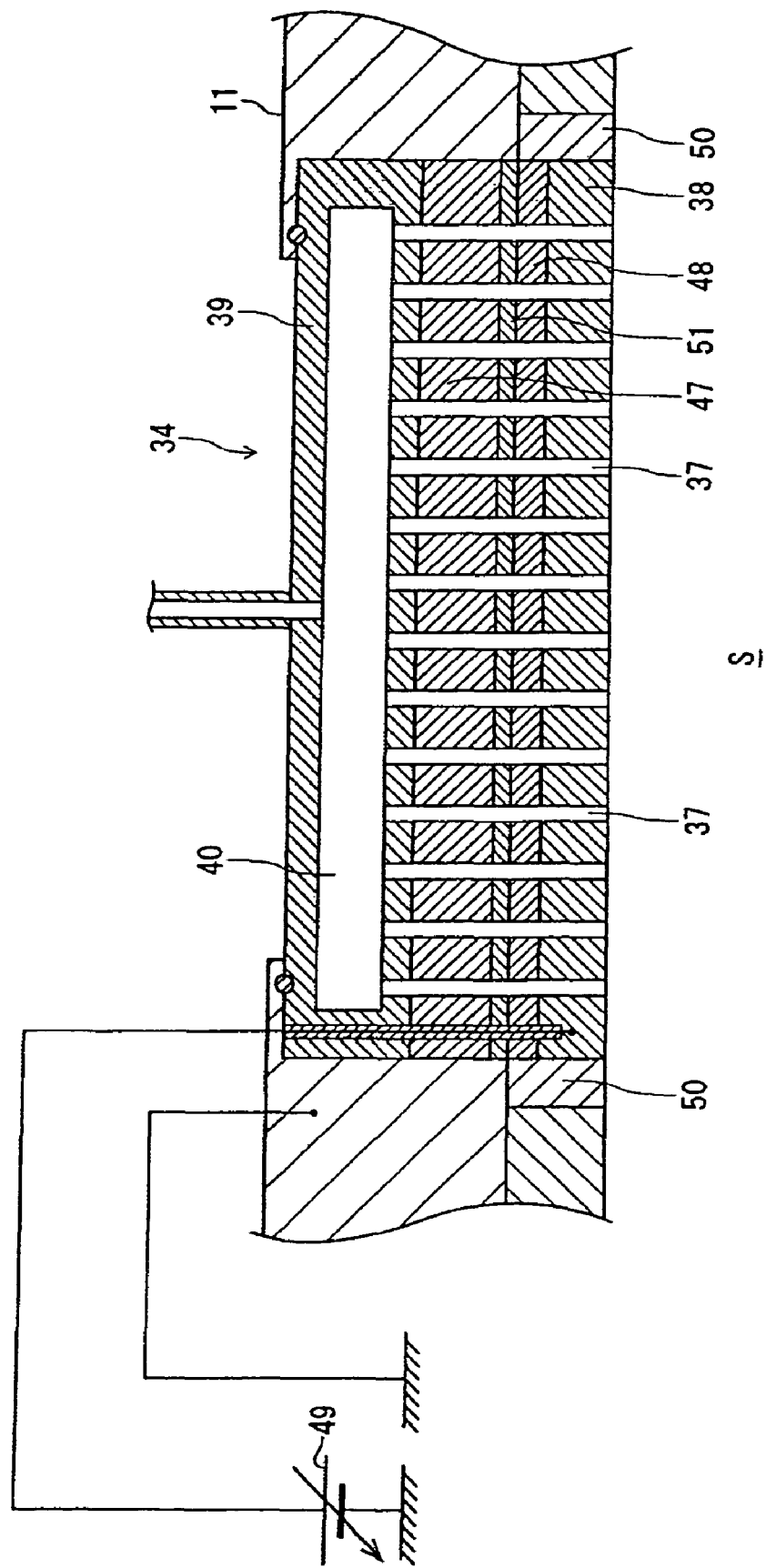
FIG. 2 is an enlarged cross-sectional view of a gas-introducing showerhead appearing in FIG. 1.

FIG. 2 is an enlarged cross-sectional view of the gas-introducing showerhead appearing in FIG. 1.

Referring to FIG. 2, the gas-introducing showerhead 34 is comprised of the disk-shaped top electrode plate 38 (second conductive member) having a surface (hereinafter referred to "the process space-side surface S") exposed to the process space S, an electrode support 39 (first conductive member) that detachably supports the top electrode plate 38 and has the buffer chamber 40, a cooling plate 47 disposed between the top electrode plate 38 and the electrode support 39, for cooling the top electrode plate 38 to a predetermined temperature during plasma processing, and an insulating film 48 (insulating member) disposed between the cooling plate 47 and the top electrode plate 38.

The electrode support 39 is electrically connected to the container 11, and the cooling plate 47 is electrically connected to the container 11 via the electrode support 39. The periphery of the top electrode plate 38 is covered by an annular insulating member 50. Therefore, the electrode support 39 and the cooling plate 47 are grounded via the container 11, whereas the top electrode plate 38 is electrically floated.

In the gas-introducing showerhead 34, the electrode support 39 is formed of a conductive material, such as aluminum coated with an anodized aluminum coating film. The cooling plate 47 is also formed of a conductive material, such as aluminum, and the top electrode plate 38 is also formed of a conductive material, such as a low-resistance silicon. On the other hand, the insulating film 48 disposed between the cooling plate 47 and the top electrode plate 38 is formed of a dielectric material (insulating material), such as polyimide, and the cooling plate 47 has an insulating film-side surface thereof formed thereon with an anodized aluminum coating film 51 (insulating member). In short, the gas-introducing showerhead 34 has a sandwich structure comprised of an upper conductive member (the electrode support 39 and the cooling plate 47), an insulating member (the insulating film 48 and the anodized aluminum coating film 51), and a lower conductive member (the top electrode plate 38). The structure having the sandwich structure comprised of the upper conductive member, the insulating member, and the lower conductive member has an electric capacity corresponding to the relative dielectric constant, the thickness, and the surface area of the insulating member, as described hereinafter. Therefore, the gas-introducing showerhead 34 has an electric capacity corresponding to the relative dielectric constants, the thicknesses, and the surface areas of the insulating film 48 and the anodized aluminum coating film 51.

In the gas-introducing showerhead 34, the voltage of the electrode support 39 and the cooling plate 47 is fixed to ground potential. When high-frequency power is applied to the process space S from the high-frequency power supply 20 or the other high-frequency power supply 46 to generate plasma, a sheath as a region with very few electrons is formed in the vicinity of the gas-introducing showerhead 34. The gas-introducing showerhead 34 has an impedance ((capacitive) reactance) with a magnitude corresponding to that of its electric capacity. When an AC current corresponding to the high-frequency power passes through the sheath and the gas-introducing showerhead 34, voltage drop from the space S to the ground (electrode support 39 and the cooling plate 47) occurs, and the voltage drop is shared by the sheath and the gas-introducing showerhead 34. The sharing ratio of the voltage drop between the sheath and the gas-introducing showerhead 34 varies with the magnitude of the (capacitive) reactance of the gas-introducing showerhead 34. Further, a potential corresponding to part of the voltage drop occurring across the gas-introducing showerhead 34 is generated on the top electrode plate 38. Therefore, it is possible to control the potential of the top electrode plate 38 by controlling the magnitude of the electric capacity of the gas-introducing showerhead 34.

The relationship between the electric capacity of the structure and the thickness and relative dielectric constant of the insulating member can be expressed by the following equation (1):

$$C = \varepsilon \times S/d \tag{1}$$

wherein C represents the electric capacity, $\varepsilon$ the relative dielectric constant, S the surface area of the insulating member, and d the thickness of the insulating member.

Therefore, it is possible to control the electric capacity of the gas-introducing showerhead 34 by changing the relative dielectric constant and thickness of the insulating film 48, and the thickness and the like of the anodized aluminum coating film 51.

Further, the relationship between the (capacitive) reactance and the electric capacity can be expressed by the following equation (2):

$$Xc = 1/(2\pi \times f \times C) \tag{2}$$

wherein Xc represents the (capacitive) reactance, and f the frequency of a high-frequency potential.

According to the above equation (2), as the electric capacity is larger, the (capacitive) reactance is smaller (see Table 1 shown below). Now, in order to remove a large amount of polymer deposited on the top electrode plate 38, it is required to reduce the voltage drop occurring across the gas-introducing showerhead 34 and lower the potential of the top electrode plate 38, thereby increasing the potential difference between the top electrode plate 38 and the process space S, and in order to reduce the voltage drop occurring across the gas-introducing showerhead 34, it is required to reduce the (capacitive) reactance. To this end, it is preferable that the electric capacity is set to a large value.

TABLE 1

| capacity (pF) | reactance (O) | |
|---|---|---|
| | 2 MHz | 40 MHz |
| 100 | 796 | 40 |
| 1000 | 79 | 4 |
| 10000 | 7.9 | 0.4 |
| 100000 | 0.8 | 0.04 |

To determine a target value of the electric capacity of the gas-introducing showerhead 34, the present inventors carried out plasma processing over a predetermined time period using the plasma processing chamber shown in FIG. 1 under a condition that the electric capacity of the gas-introducing showerhead 34 was set to 150 pF, and then investigated the amount of polymer deposited and remaining on the top electrode plate 38. The results showed that there was a large amount of polymer deposited on the top electrode plate 38. On the other hand, when the electric capacity of the gas-introducing showerhead 34 was set to 1000 pF, it was found that there was very little polymer deposited on the top electrode plate 38. Further, when the electric capacity of the gas-introducing showerhead 34 was set to 50000 pF, it was found that polymer was completely removed from the top electrode plate 38. From the above, it is apparent that when the electric capacity of the gas-introducing showerhead 34 is set to 1000 pF or more, it is possible to sufficiently reduce the (capacitive) reactance of the gas-introducing showerhead 34, thereby sufficiently reducing a voltage drop occurring across the gas-introducing showerhead 34. As a consequence, the present inventors found it possible to sufficiently lower the potential of the top electrode plate 38 and hence sufficiently increase the potential difference between the top electrode plate 38 and the process space S, thereby efficiently remove polymer deposited on the gas-introducing showerhead 34. From the above, it is preferred that the electric capacity of the gas-introducing showerhead 34 is set to 1000 pF or more, and more preferably, it is set to 50000 pF or more.

Further, to increase the electric capacity of the gas-introducing showerhead 34, as is apparent from the equation (1), it is preferable to reduce the thickness of the insulating film 48. When the thickness of the insulating film 48 is reduced, it is possible to increase the thicknesses of the top electrode plate 38 and the cooling plate 47. This is also preferable from the viewpoint of temperature controllability because the thermal capacities of the top electrode plate 38 and the cooling plate 47 increases. Also, to increase the electric capacity of the gas-introducing showerhead 34, as is apparent from the equation (1), a dielectric member having a large relative dielectric constant may be used as the insulating film 48. Any of dielectric materials listed in Table 2 shown below can be used to form the insulating film 48. In the plasma processing chamber according to the present embodiment, the insulating film 48 is formed of polyimide from the viewpoint of ease of machining.

TABLE 2

| | relative dielectric constant: ∈ |
|---|---|
| Vaccum | 1.0 |
| Al$_2$O$_3$ | 9.9 (at 1 MHz) |
| Sprayed Y$_2$O$_3$ | 9.7 (at 1 MHz) |
| SiO$_2$ | 3.6 (at 1 MHz) |
| PTFE | 2.0 |
| Polyimide | 2.9 |

Assuming that the insulating film 48 is formed of polyimide, the relationship between the thickness of the insulating film 48 (polyimide film) and the electric capacity (C2) of the insulating film 48 alone, and the relationship between the thickness of the insulating film 48 and the synthesized electric capacity (C1+C2) of the insulating film 48 and the anodized aluminum coating film 51, i.e. the electric capacity of the gas-introducing showerhead 34 are as shown in Table 3 below.

TABLE 3

| polyimide film | capacity (pF) | |
|---|---|---|
| thickness (μm) | C1 | C1 + C2 |
| 25 | 116000 | 53640 |
| 50 | 57900 | 36640 |
| 75 | 38600 | 27830 |
| 100 | 20000 | 16660 |
| 200 | 10000 | 9090 |

In this case, as mentioned above, it is preferred that the electric capacity of the gas-introducing showerhead 34 is set to 1000 pF or more, and the insulating film 48 has a reduced thickness from the viewpoint of temperature controllability of the top electrode plate 38. For this reason, in the plasma processing chamber according to the present embodiment, the thickness of the insulating film 48 is set to 25 μm.

It should be noted that the correct value of the electric capacity of the gas-introducing showerhead 34 varies with the kind of plasma processing or the kind of a process gas. More specifically, in plasma processing in which the amount of deposited polymer is large (deposition-incurring processing), it is required to reduce the voltage drop occurring across the gas-introducing showerhead 34 by reducing the (capacitive) reactance thereof, to thereby lower the potential of the top electrode plate 38 and increase the potential difference between the top electrode plate 38 and the process space S. Therefore, it is preferred that the electric capacity of the gas-introducing showerhead 34 is large. On the other hand, in deposition-free processing, it is required to raise the potential of the top electrode plate 38 by increasing the (capacitive) reactance of the gas-introducing showerhead 34 and the voltage drop occurring across the gas-introducing showerhead 34, to thereby reduce the potential difference between the top electrode plate 38 and the process space S. Therefore, it is preferred that the electric capacity of the gas-introducing showerhead 34 is small. The material and thickness of the insulating film 48 are not limited to the above (polyimide, and 25 μm), but they are set according to a desired electric capacity of the gas-introducing showerhead 34.

The material of the insulating film 48 may be selected not only from the viewpoint of ease of machining, but also from other viewpoints. For example, the efficiency of heat transfer between the top electrode plate 38 and the cooling plate 47 (or the electrode support 39) can be enhanced by selecting an insulating material having a high heat transfer efficiency, and therefore it is preferred to select at least one of metal oxides, such as yttria, alumina ($Al_2O_3$), and silica ($SiO_2$), and metal nitrides, such as aluminum nitride (AlN). Further, to attain high heat conductivity and high insulation between the top electrode plate 38 and the cooling plate 47 (or the electrode support 39) at the same time, it is preferred to select SiC, a silicon (Si) compound, or a methyl polymer (organosilicon compound) (e.g. silicone oil). Furthermore, to attain a large electric capacity and high insulation at the same time, it is preferred to select one from organic functional materials (organic substances), such as polyimide mentioned above, PTFE, and fluororubber. Further, if a vacuum layer is formed between two conductive members, the vacuum layer insulates the conductive members from each other. Therefore, the vacuum layer may be formed between the cooling plate 47 and the top electrode plate 38 in place of the insulating film 48. Alternately, an air layer may be formed between the cooling plate 47 and the top electrode plate 38, or a gap between the cooling plate 47 and the top electrode plate 38 may be filled with a liquid, such as Galden (registered trademark) or Fluorinert (registered trademark).

Conventionally, in a plasma processing chamber, a high-frequency power supply is connected to a top electrode plate of a gas-introducing showerhead. In the case where high-frequency power is supplied from the high-frequency power supply to the top electrode plate, even if polymer is deposited on a surface of the top electrode plate which faces a process space, and thereby forms an insulating film on the surface of the top electrode plate, the high-frequency power passes through the insulating film, so that the top electrode plate can apply the supplied high-frequency power to the process space.

However, the high-frequency power supply necessitates a matcher so as to supply the high-frequency power to the top electrode plate, which makes the construction of the plasma processing chamber complicated. Further, since a high-frequency potential is generated on the top electrode plate by the supplied high-frequency power, the potential of the top electrode plate periodically changes, and a state in which positive ions are drawn by the top electrode plate and a state in which electrons are drawn by the top electrode plate repeatedly alternately occur. Therefore, electrons disappear from the process space at a predetermined rate, which causes degradation of the efficiency of plasma processing.

On the other hand, in the case where DC power is supplied to the top electrode plate from a DC power supply, no matcher is required. Further, the potential of the top electrode plate does not change, which makes it possible to maintain the state in which only positive ions are drawn, and prevent electrons from disappearing from the process space, so that the efficiency of plasma processing can be enhanced. However, when polymer is deposited on the surface of the top electrode plate which faces the process space, the DC power cannot pass through an insulating film formed of polymer, so that the top electrode plate cannot apply the supplied DC power to the process space. Further, if the top electrode plate is not electrically floated, it is impossible to supply DC power to the top electrode plate.

In contrast, as described hereinabove, the gas-introducing showerhead 34 as the structure for a plasma processing chamber, according to the present embodiment, has an electric capacity of a predetermined value so as to properly remove polymer deposited on the top electrode plate 38, and the top electrode plate 38 is electrically floated to make it possible to supply DC power to the top electrode plate 38. More specifically, a CEL DC power supply 49 is electrically connected to the top electrode plate 38 that is electrically floated, so that the top electrode plate 38 applies the DC power supplied from the CEL DC power supply 49 to the process space S.

According to the present embodiment, the gas-introducing showerhead 34 is comprised of the electrode support 39 and the cooling plate 47 that are electrically grounded, the top electrode plate 38 that is disposed between the electrode support 39 and the process space S and is electrically floating with the one surface thereof exposed to the process space S, and the insulating film 48 formed of polyimide and the anodized aluminum coating film 51 which are disposed between the electrode support 39 and the top electrode plate 38.

As described above, the gas-introducing showerhead 34 having the sandwich structure comprised of the upper conductive member (the electrode support 39 and the cooling plate 47), the insulating member (the insulating film 48 and the anodized aluminum coating film 51), and the lower conductive member (the top electrode plate 38) has an electric capacity of a predetermined value. In the gas-introducing showerhead 34, the voltage of the electrode support 39 and the cooling plate 47 is fixed to the ground potential. When high-frequency power is applied to the process space S from the high-frequency power supply 20 or the other high-frequency power supply 46 to generate plasma, a sheath as a region with very few electrons is formed in the vicinity of the gas-introducing showerhead 34. The gas-introducing showerhead 34 has an impedance ((capacitive) reactance) with a magnitude corresponding to that of its electric capacity. When an AC current corresponding to the high-frequency power passes through the sheath and the gas-introducing showerhead 34, voltage drop occurs from the process space S to the ground (electrode support 39 and the cooling plate 47), and the voltage drop is shared by the sheath and the gas-introducing showerhead 34. The sharing ratio of the voltage drop between the sheath and the gas-introducing showerhead 34 varies with the magnitude of the (capacitive) reactance of the gas-introducing showerhead 34. Further, a potential corresponding to part of the voltage drop occurring across the gas-introducing showerhead 34 is generated on the top electrode plate 38. Therefore, it is possible to control the potential (the potential of the process space-side surface S) of the top electrode plate 38 by controlling the magnitude of the electric capacity of the gas-introducing showerhead 34 without using a potential control circuit. This makes it possible not only to control the potential of the process space-side surface S of the top electrode plate 38, but also to simplify the construction of the plasma processing chamber. Further, by controlling the potential of the process space-side surface S of the top electrode plate 38, it is possible to properly control the amount of polymer to be removed from the top electrode plate 38 in the deposition-incurring processing, and prevent the top electrode plate 38 from being shaved in the deposition-free processing.

In the gas-introducing showerhead 34, the top electrode plate 38 is electrically connected to the CEL DC power supply 49. In the case where the CEL DC power supply 49 is connected to the top electrode plate 38 to supply DC power to the top electrode plate 38, it is not required to use a matcher. Further, since only ions are drawn to the top electrode plate 38, but electrons are not, it is possible to prevent the number of electrons from being decreased in the process space S. This makes it possible to further simplify the construction of the plasma processing chamber, and enhance the efficiency of plasma processing.

As the material of the insulating film 48 in the gas-introducing showerhead 34, at least one of metal oxides, such as yttria, alumina, and silica, and metal nitrides, such as aluminum nitride, may be selected. The thus selected material makes it possible to enhance the efficiency of heat transfer between the top electrode plate 38 and the cooling plate 47 (or the electrode support 39), to thereby easily control the temperature of the gas-introducing showerhead 34.

Alternatively, an organosilicon compound may be selected as the material of the insulating film 48 in the gas-introducing showerhead 34. The selection of this material makes it possible to attain high heat conductivity and high insulation between the top electrode plate 38 and the cooling plate 47 (or the electrode support 39) at the same time.

Further alternatively, an organic functional material may be selected as the material of the insulating film 48 in the gas-introducing showerhead 34. This material makes it possible not only to maintain high insulation but also to increase the electric capacity of the gas-introducing showerhead 34 with ease.

Although in the above-described embodiment, the high-frequency power supply 20 and the other high-frequency power supply 46 are connected to the susceptor 12 in the plasma processing chamber 10, the susceptor 12 may have only one of the high-frequency power supplies connected thereto.

Further, a high-frequency power supply that supplies a high-frequency power of such a weak output as not to generate a potential on the process space-side surface S of the top electrode plate 38 may be connected to the gas-introducing showerhead 34.

Next, a description will be given of a plasma processing chamber provided with a structure for a plasma processing chamber, according to a second embodiment of the present invention.

The present embodiment has basically the same construction and effects as those of the above-described first embodiment, and is distinguished from the first embodiment only in that the thickness of the insulating film is not fixed or uniform but is progressively reduced toward a central part of the top electrode plate. Therefore, duplicate description of the construction and effects is omitted, and only different points of the construction and effects of the present embodiment from the first embodiment will be described hereafter.

Figure 3:
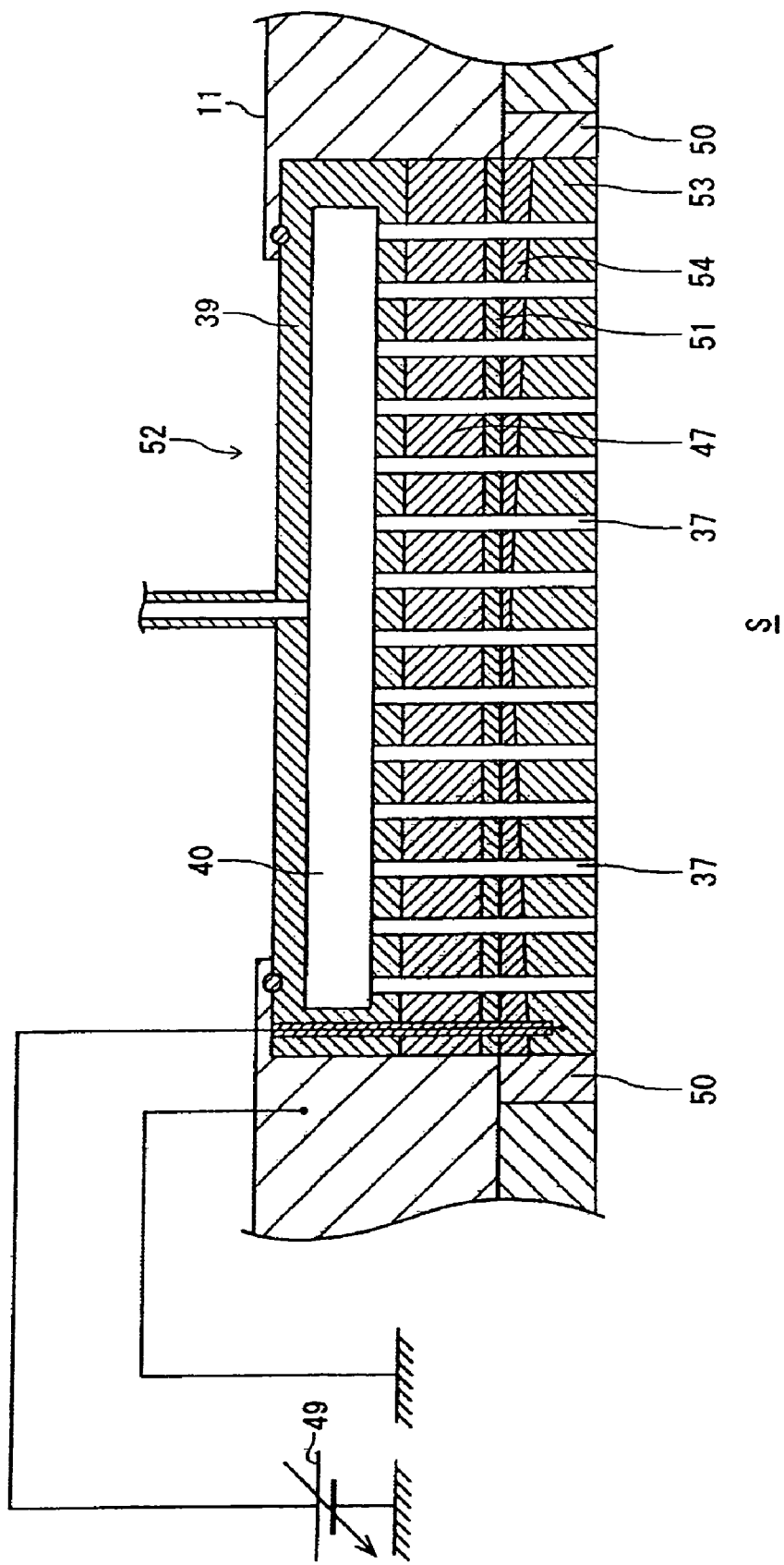
FIG. 3 is an enlarged cross-sectional view of a gas-introducing showerhead as a structure for a plasma processing chamber, according to a second embodiment of the present invention.

FIG. 3 is an enlarged cross-sectional view of a gas-introducing showerhead as the structure for a plasma processing chamber, according to the present embodiment.

Referring to FIG. 3, the gas-introducing showerhead 52 is comprised of a disk-shaped top electrode plate 53 (second conductive member) having a surface exposed to the process space S, the electrode support 39 (first conductive member) that detachably supports the top electrode plate 53 and has the buffer chamber 40, the cooling plate 47 disposed between the top electrode plate 53 and the electrode support 39, for cooling the top electrode plate 53 to a predetermined temperature during plasma processing, and an insulating film 54 (insulating member) disposed between the cooling plate 47 and the top electrode plate 53.

In general, in a plasma processing chamber, the density of plasma generated in a process space sometimes progressively increases toward the central part of a container, i.e. the central part of a top electrode plate, causing non-uniform deposition of polymer on the top electrode plate in deposition-incurring processing. More specifically, the amount of polymer deposited on the top electrode plate sometimes progressively increases toward the central part of the top electrode plate. In such a case, to properly remove the polymer non-uniformly deposited on the top electrode plate, it is preferred that a potential generated on the process space-side surface of the top electrode plate is progressively reduced toward the central part of the top electrode plate.

To meet this preference, in the gas-introducing showerhead 52 as the structure for a plasma processing chamber, according to the present embodiment, the insulating film 54 is formed to have a non-uniform thickness varying with location. More specifically, the insulating film 54 has a thickness progressively reduced toward the central part of the top electrode plate 53, i.e. a central part of the container 11. As shown in Table 3, described hereinabove, the smaller the thickness of the insulating film, the larger the electric capacity. Accordingly, in the gas-introducing showerhead 52, as the location varies toward the central part of the top electrode plate 53, the local and partial electric capacity progressively increases and the local and partial (capacitive) reactance progressively decreases, so that it is possible to progressively reduce voltage drop occurring across the gas-introducing showerhead 52 as the location varies toward the central part of the top electrode plate 53, whereby the potential generated on the process space-side surface S of the top electrode plate 53 can be progressively lowered toward the central part of the same.

According to the gas-introducing showerhead 52 of the present embodiment, since the thickness of the insulating film 54 varies with location, it is possible to appropriately change the potential generated on each portion of the top electrode plate 53 according to the amount of polymer to be deposited on the portion, whereby the amount of polymer deposited on each portion can be made uniform. More specifically, since the thickness of the insulating film 54 is progressively reduced toward the central part of the container, it is possible to easily generate an appropriate potential according to the amount of deposited polymer which progressively increases toward the central part.

Although in the above-described gas-introducing showerhead 52, the thickness of the insulating film 54 varies with location, this is not limitative, but the insulating film 54 may have portions formed of different materials. More specifically, the insulating film 54 may be formed to have portions formed of respective different materials with different relative dielectric constants according to locations, such that the relative dielectric constant of each portion of the entire insulating film 54 progressively increases toward the central part of the top electrode plate 53. In this case as well, in the gas-introducing showerhead 52, the (capacitive) reactance progressively decreases toward the central part of the top electrode plate 53, so that it is possible to progressively reduce the voltage drop occurring across the gas-introducing showerhead 52 as the location changes toward the central part of the top electrode plate 53, whereby the potential generated on the process space-side surface S of the top electrode plate 53 can be progressively lowered toward the central part of the same.

Although in the above-described embodiments, the gas-introducing showerhead has the insulating film 48 (54) and the anodized aluminum coating film 51 as the insulating member, the gas-introducing showerhead may have an insulating film alone as the insulating member.

Further, although in the above-described embodiments, the gas-introducing showerhead is formed as a structure separate from the container 11, a part of the gas-introducing showerhead may be formed by a part of the container 11. For example, a lid member of the electrode support 39 may be formed by a part of the container 11.

Furthermore, although in the gas-introducing showerhead of each of the above-described embodiments, the insulating film as an insulating member is disposed between the top electrode plate and the cooling plate, the location where the insulating film is disposed is not limited to this, but the insulating film may be disposed at any location insofar as the location is between the electrically grounded conductive member and the electrically floating conductive member.

Figure 4:
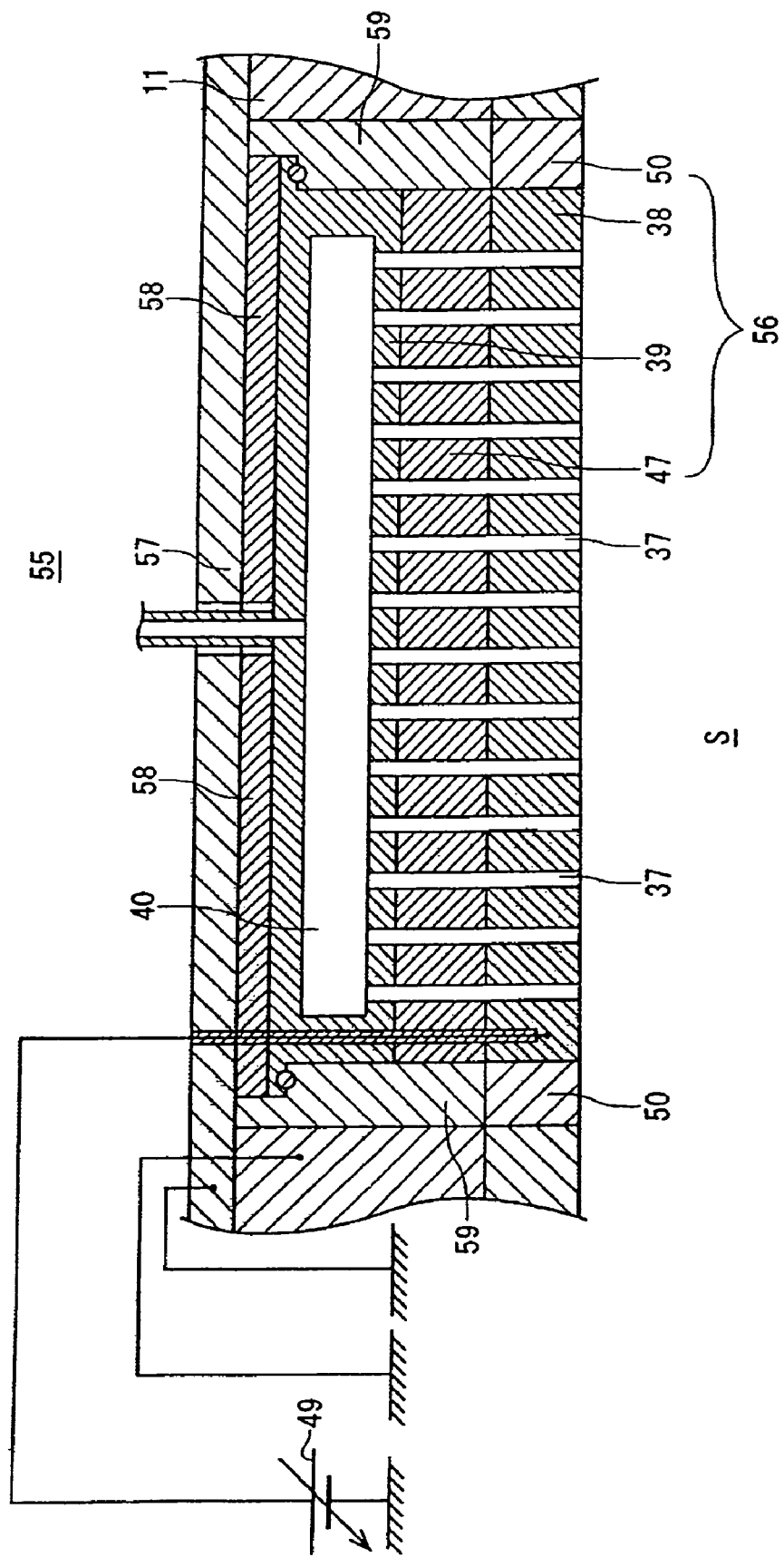
FIG. 4 is an enlarged cross-sectional view of a variation of the structure for a plasma processing chamber, according to the first embodiment.

For example, the present invention can also be applied to a structure for a plasma processing chamber, described hereafter with reference to FIG. 4.

The structure 55 for a plasma processing chamber, shown in FIG. 4, includes a chamber lid 57 covering from above, as viewed in FIG. 4, a gas-introducing showerhead 56 comprised of the top electrode plate 38, the cooling plate 47, and the electrode support 39. The chamber lid 57 is formed of a conductive member, such as aluminum, and is electrically grounded. Further, the structure 55 for a plasma processing chamber is provided with an insulating film 58 that is formed of polyimide and is disposed between the electrode support 39 and the chamber lid 57.

The gas-introducing showerhead 56 is distinguished from the gas-introducing showerhead 34 in that the insulating film 48 and the anodized aluminum coating film 51 are not provided, and that the peripheries of the electrode support 39 and the cooling plate 47 are covered by an annular insulating member 59. In the gas-introducing showerhead 56, not only the top electrode plate 38 but also the cooling plate 47 and the electrode support 39 are electrically floating.

The above-described structure 55 for a plasma processing chamber has a sandwich structure comprised of an electrically grounded conductive member (the chamber lid 57), an insulating member (the insulating film 58), and an electrically floating conductive member (the electrode support 39, the cooling plate 47, and the top electrode plate 38). Therefore, the structure 55 for a plasma processing chamber can provide the same advantageous effects as provided by the gas-introducing showerhead 34 according to the first embodiment.

The material of the insulating film 58 is not limited to polyimide, but any one of metal oxides, such as yttria, alumina, and silica, metal nitrides, such as aluminum nitride, SiC, silicon compounds and methyl polymers, and organic functional materials, such as PTFE and fluororubber may be selected as the material of the insulating film 58. Alternatively, an air layer may be formed in place of the insulating film 58 between the chamber lid 57 and the electrode support 39, or a gap between the chamber lid 57 and the electrode support 39 may be filled with a liquid, such as Galden (registered trademark) or Fluorinert (registered trademark).

Although in the above description, the gas-introducing showerhead 56 is not provided with the insulating film 48 and the anodized aluminum coating film 51, the cooling plate 47 may be provided with the anodized aluminum coating film 51 similarly to the first embodiment.

Although in the above-described embodiments, the gas-introducing showerheads are described as the structure for a plasma processing chamber, to which is applied the present invention, this is not limitative, but the present invention can also be applied e.g. to a structure provided on the inner wall of the container. Further, the plasma processing chamber does not always have only one structure for a plasma processing chamber to which is applied the present invention, but it may have a plurality of structures to which the present invention is applied.

Further, the distribution of plasma density in a container included in a plasma processing chamber can be changed by controlling the electric capacity of an associated structure for a plasma processing chamber to which the present invention is applied. Therefore, it is possible to control not only the removal amount of polymer deposited on the structure but also the removal amount of polymer deposited on the other structures.

Next, a description will be given of a plasma processing chamber provided with a plasma processing chamber component according to a third embodiment of the present invention.

The present embodiment has basically the same construction and effects as those of the above-described first embodiment, and is distinguished from the first embodiment only in that a plasma processing chamber component facing a process space within a container has a sprayed coating formed of an insulating material, and the thickness of the sprayed coating is set based on the amount of polymer to be deposited on the component. Therefore, duplicate description of the construction and effects is omitted, and only different points of the construction and effects of the present embodiment from the first embodiment will be described hereafter.

Referring again to FIG. 1, polymer (deposits) is deposited on the surface of the container sidewall member 45 facing the process space S within the container 11 and the respective surfaces of the exhaust plate 14 and the susceptor side surface-covering member 60 each facing the exhaust passage 13 as part of the space within the container 11, similarly to the top electrode plate 38.

When heated, polymer is activated and decomposed. Therefore, a method has conventionally been employed in which a heater is embedded in the sidewall of a container to heat polymer deposited on the sidewall of the container to thereby remove the polymer. However, it is sometimes difficult to dispose heaters in the exhaust plate and the susceptor side surface-covering member, and hence in such a case, deposited polymer cannot be removed.

Of course, a method can also be employed in which potentials on the container sidewall member, the exhaust plate, and the susceptor side surface-covering member are controlled to cause collision of positive ions against these components, to thereby remove the polymer. However, the amounts of the polymer deposited on the container sidewall member, the exhaust plate, and the susceptor side surface-covering member are not the same.

For example, when a heater is embedded in the container sidewall member, polymer to be deposited on the surface of the container sidewall member is thermally decomposed into gaseous molecules, and the gaseous molecules sometimes reach the exhaust plate and the susceptor side surface-covering member and are deposited as polymer on the respective surfaces of these components. As a result, the amount of polymer deposited on the surfaces of the exhaust plate and the susceptor side surface-covering member may become larger than that of polymer deposited on the surface of the container sidewall member.

On the other hand, when a heater is not embedded in the container sidewall member, the amount of polymer deposited on the surface of the container sidewall member sometimes becomes larger than that of polymer deposited on the surfaces of the exhaust plate and the susceptor side surface-covering member. Further, in some cases, the surface of the exhaust plate and that of the susceptor side surface-covering member are not covered by polymer (i.e. exposed), and in such cases, there is a fear that the exhaust plate and the susceptor side surface-covering member are shaved by collision of positive ions.

Further, when a corrosive gas is used as a process gas, the container sidewall member is covered by quartz, but in this case as well, the amount of polymer deposited on the surface of the container sidewall member becomes larger than that of polymer deposited on the surfaces of the exhaust plate and the susceptor side surface-covering member which are not covered by quartz.

For these reasons, even if the respective potentials on the container sidewall member, the exhaust plate, and the susceptor side surface-covering member are controlled such that these respective potentials are the same, polymer deposited on these components cannot be properly removed.

To solve the above problem, each of a container sidewall member, an exhaust plate, and a susceptor side surface-covering member as the plasma processing chamber component according to the present embodiment is configured as shown in FIG. 5.

Figure 5A:
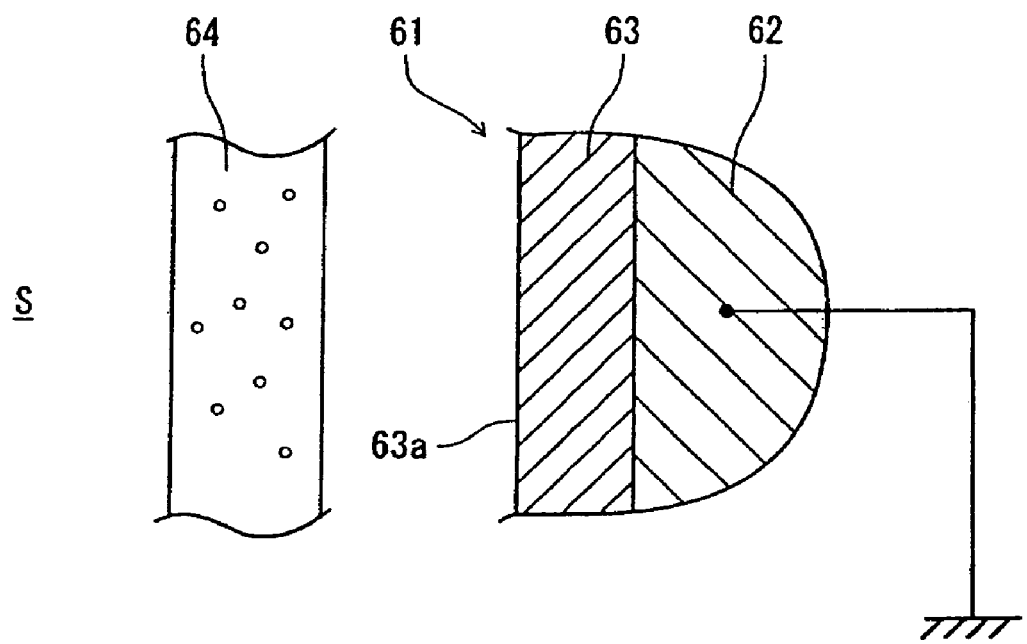
Figure 5B:
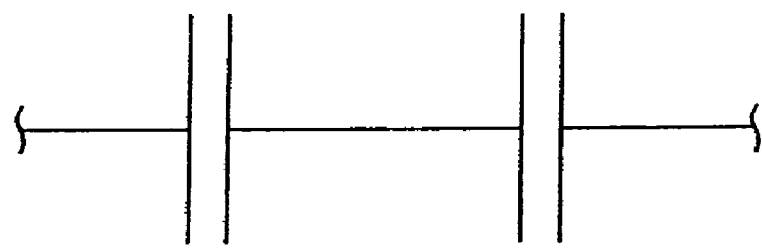

FIGS. 5A and 5B are schematic views of a plasma processing chamber component according to the present embodiment, in which FIG. 5A shows the positional relationship between a sheath and the component, and FIG. 5B schematically shows the sheath and the component as an electric circuit.

Referring to FIG. 5A, a plasma processing chamber component (the container sidewall member, the exhaust plate, or the susceptor side surface-covering member) 61 is comprised of an electrically grounded base part 62 formed of a conductive material, such as aluminum, and a sprayed coating 63 (an insulating part) covering the base part 62 and facing the process space S. The sprayed coating 63 is formed of an insulating material, such as yttria, alumina, silica, or aluminum nitride.

When plasma is generated in the process space S, the sheath 64 is formed in the vicinity of the plasma processing chamber component 61 in facing relation to the sprayed coating 63. The sheath 64 is a region with very few electrons, and hence it has the same property as an insulating film. Therefore, as shown in FIG. 5B, the sheath 64 and the sprayed coating 63 of the plasma processing chamber component 61 function as two capacitors connected in series. Further, each of the sheath 64 and the sprayed coating 63 has an electric capacity corresponding to its thickness and relative dielectric constant (see the equation (1)), and a (capacitive) reactance corresponding to the electric capacity (see the equation (2)). When an electric current passes through the two capacitors connected in series, voltage drop occurs, and the sharing ratio of the voltage drop between the two capacitors is determined based on the magnitudes of the respective (capacitive) reactances of the two capacitors. Therefore, it is possible to control the amount of voltage drop which is to occur across the plasma processing chamber component 61 by controlling the magnitude of the electric capacity of the sprayed coating 63, to thereby control the potential to be generated on a surface 63a of the sprayed coating 63 which faces the process space S. Further, since the magnitude of the electric capacity of the sprayed coating 63 can be changed by changing the thickness of the sprayed coating 63, it is possible to control the potential of the sprayed coating 63 by changing the thickness of the same.

Figure 6A:
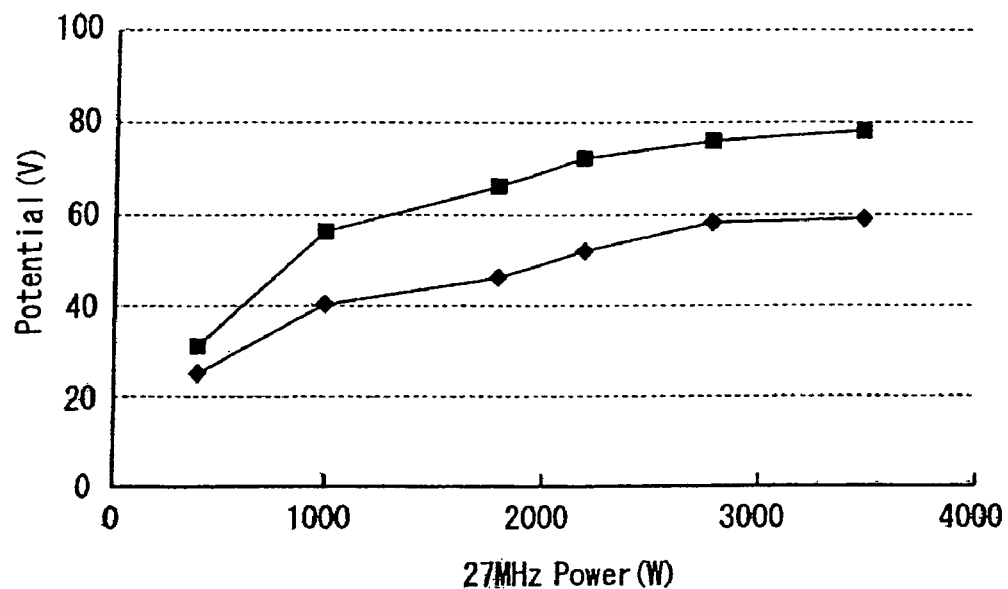
Figure 6B:
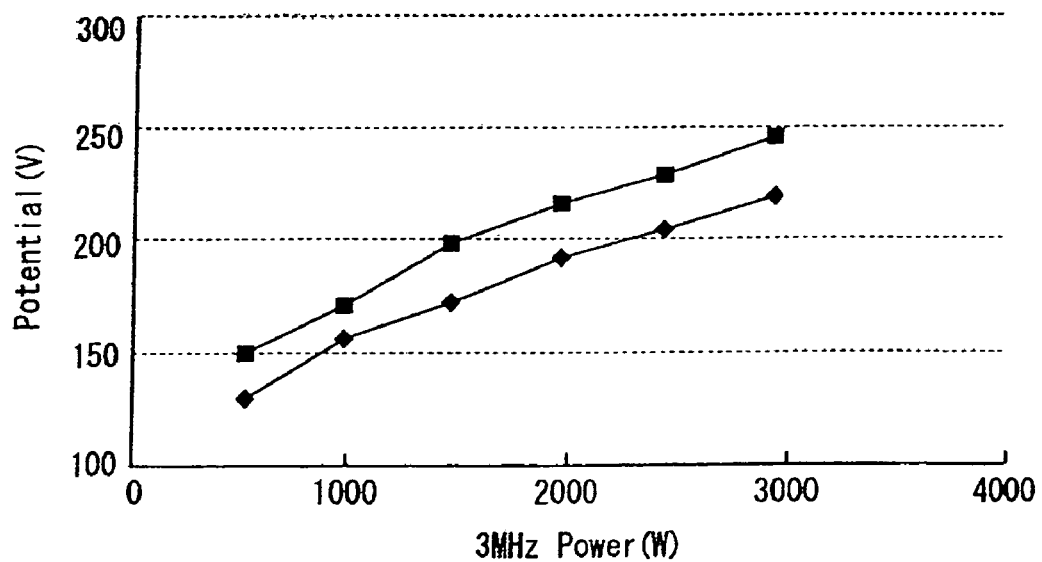

In order to confirm the above principles, the present inventors measured a potential of the sprayed coating 63 obtained whenever the thickness of the sprayed coating 63 and the magnitude of high-frequency power applied to the process space S are changed, and the results of the measurement are shown as graphs in FIGS. 6A and 6B.

FIGS. 6A and 6B are graphs showing changes in the potential of a yttria coating as the sprayed coating on the plasma processing chamber component, which occurred when the thickness of the yttria coating and the magnitude of high-frequency power were changed, in which FIG. 6A shows a case where a high-frequency power of 27 MHz was applied to the process space, and FIG. 6B shows a case where a high-frequency power of 3 MHz was applied to the process space. In FIGS. 6A and 6B, marks "■" represent values obtained when the yttria coating had a thickness of 200 μm, and marks "♦" represent values obtained when the yttria coating had a thickness of 100 μm.

It is apparent from FIGS. 6A and 6B, that even when the magnitude or the frequency of the high-frequency power is changed, a potential obtained when the yttria coating has a thickness of 100 μm is always lower than a potential obtained when the yttria coating has a thickness of 200 μm, whereby it was confirmed that the potential of the sprayed coating 63 can be controlled by changing the thickness of the same. Further, it was found that as the thickness of the sprayed coating 63 is smaller, the (capacitive) reactance of the sprayed coating 63 can be made smaller (see the equations (1) and (2)), and therefore it is possible to reduce the amount of voltage drop which is to occur across the plasma processing chamber component 61, so that the potential of the sprayed coating 63 can be lowered.

Further, in view of the aforementioned fact that the amounts of polymer deposited on the container sidewall member, the exhaust plate, and the susceptor side surface-covering member are not the same, each of the container sidewall member, the exhaust plate, and the susceptor side surface-covering member as the plasma processing chamber component according to the present embodiment has a sprayed coating of an insulating material formed to have a thicknesses set therefor according to the amount of polymer to be deposited thereon.

More specifically, when the amounts of polymer deposited on the respective surfaces of the exhaust plate and the susceptor side surface-covering member are larger than that of polymer deposited on the surface of the container sidewall member, the thicknesses of the respective sprayed coatings on the exhaust plate and the susceptor side surface-covering member are set to be smaller than that of the sprayed coating on the container sidewall member. As a result, the potentials of the exhaust plate and the susceptor side surface-covering member become lower than that of the container sidewall member, thereby making it possible to make the potential difference between the process space S and the exhaust plate or the susceptor side surface-covering member larger than that between the process space S and the container sidewall member. In short, it is possible to set the potential of each of the container sidewall member, the exhaust plate, and the susceptor side surface-covering member to a voltage corresponding to the amount of polymer to be deposited on the component. This enables larger amounts of polymer to be removed from the surfaces of the exhaust plate and the susceptor side surface-covering member than from that of the container sidewall member, which makes it possible to properly remove polymer from the container sidewall member, the exhaust plate, and the susceptor side surface-covering member which are different in the amount of deposition of polymer.

On the other hand, when the amount of polymer deposited on the surface of the container sidewall member is larger than those of polymer deposited on the respective surfaces of the exhaust plate and the susceptor side surface-covering member, the thickness of the sprayed coating on the container sidewall member is set to be smaller than those of the respective sprayed coatings on the exhaust plate and the susceptor side surface-covering member. As a result, the potential of the container sidewall member becomes lower than those of the exhaust plate and the susceptor side surface-covering member, thereby making it possible to make the potential difference between the process space S and the container sidewall member larger than that between the process space S and the exhaust plate or the susceptor side surface-covering member.

This makes it possible to remove a larger amount of polymer from the container sidewall member than from the surfaces of the exhaust plate and the susceptor side surface-covering member, which makes it possible to properly remove polymer from the exhaust plate, the susceptor side surface-covering member, and the container sidewall member which are different in the amount of deposition of polymer. Further, it is possible to prevent exposure of the surfaces of the exhaust plate and the susceptor side surface-covering member, thereby preventing these components from being shaved by collision of positive ions.

According to the plasma processing chamber component of the present embodiment, since the plasma processing chamber component is comprised of the electrically grounded base part 62 formed of a conductive material, and the sprayed coating 63 formed of an insulating material, which covers the base part 62 and faces the process space S, and the thickness of the sprayed coating 63 is set according to the amount of polymer to be deposited on the surface 63a of the sprayed coating 63, it is possible to set the potential of the sprayed coating 63 to a voltage corresponding to the amount of polymer to be removed, thereby achieving appropriate polymer removal.

In the above-described plasma processing chamber component 61, the sprayed coating 63 is formed of sprayed yttria, alumina, silica, or aluminum nitride, so that the thickness of the sprayed coating 63 can easily be set to a desired value, which facilitates polymer removal.

Although the above-described plasma processing chamber component 61 has the sprayed coating 63 as an insulating part, an insulating member in the form of a plate, such as a quartz plate, may be laminated on the base part 62 as an insulting part. This makes it possible to simplify the construction of the plasma processing chamber component 61, which contributes to simplification of the construction of the plasma processing chamber 10.

Although in the above-described plasma processing chamber component 61, the sprayed coating 63 as an insulating part faces the process space S, this is not limitative, but the insulating part may be disposed between an electrically floating conductive part facing the process space S and an electrically grounded conductive part. In short, the plasma processing chamber component 61 may have the same sandwich structure as the gas-introducing showerhead 34 described hereinabove. In this case as well, the potential of the conductive part facing the process space S can be controlled by changing the thickness of the insulating part, and further the thickness of the insulating part may be set according to the amount of polymer deposited on the surface of the conductive part facing the process space S. This makes it possible to properly remove deposited polymer.

Further, although the container sidewall member, the exhaust plate, and the susceptor side surface-covering member each have a sprayed coating formed of an insulating material, if the amount of deposited polymer is too large, the components need not have the sprayed coating. In this case, the potential difference between the process space S and the surface of the container sidewall member, the exhaust plate, or the susceptor side surface-covering member can be further increased, which makes it possible to remove a large amount of polymer.

Although in the above-described embodiments, the present invention is applied to a plasma processing chamber for carrying out RIE or ashing on a semiconductor wafer, this is not limitative, but the present invention can be applied to any plasma processing chamber insofar as it carries out plasma processing on a semiconductor wafer.

Further, although in the plasma processing chamber according to each of the above-described embodiments, a substrate to be processed is a semiconductor wafer, this is not limitative, but the substrate may be a glass substrate e.g. for an LCD (Liquid Crystal Display), an FPD (Flat Panel Display), or the like.

What is claimed is:

1. A structure for a plasma processing chamber including a container having a process space for receiving a substrate, and a mounting stage disposed in the container, for mounting the received substrate thereon, the mounting stage being connected to at least one high frequency power supply, the structure being disposed in the plasma processing chamber and comprising:

a conductive plate-shaped cooling member that is electrically grounded;

a plate-shaped electrode that is disposed between said conductive plate-shaped cooling member and the process space and is electrically floating, said plate-shaped electrode having a surface exposed to the process space, said plate-shaped electrode being cooled by said conductive plate-shaped cooling member;

an insulating member that includes a first insulation member formed of a dielectric material and a second insulation member formed of an anodized aluminum, and that is disposed between said conductive plate-shaped cooling member and said plate-shaped electrode such as not to generate any gap between said conductive plate-shaped cooling member and said insulating member, between said plate-shaped electrode and said insulating member, and between said first insulation member and said second insulation member; and a support member that includes an buffer chamber therein and is disposed such as not to generate any gap between said conductive plate-shaped cooling member and said support member, wherein said plate-shaped electrode, said insulating member, said conductive plate-shaped cooling member and said support member are superposed in this order to cooperatively compose a showerhead which introduces a gas to the process space, and the showerhead provides a plurality of gas holes that penetrate straight through each of said conductive plate-shaped cooling member, said plate-shaped electrode and said insulating member, respectively, and wherein the plurality of gas holes communicate with the buffer chamber of said support member.

2. A structure as claimed in claim 1, wherein said plate-shaped electrode is connected to a DC power supply.

3. A structure as claimed in claim 1, wherein the structure has an electric capacity of not smaller than 1000 pF.

4. A structure as claimed in claim 3, wherein the structure has an electric capacity of not smaller than 50000 pF.

5. A structure as claimed in claim 1, wherein said insulating member is formed of at least one material selected from the group consisting of metal oxides and metal nitrides.

6. A structure as claimed in claim 1, wherein said insulating member is formed of an organosilicon compound.

7. A structure as claimed in claim 1, wherein said insulating member is formed of an organic substance.

8. A structure as claimed in claim 1, wherein said insulating member has a thickness that continuously decreases toward a central part of the container.

9. A structure as claimed in claim 1, wherein said insulating member has portions thereof formed of respective different materials.

10. A structure as claimed in claim 9, wherein the materials forming said insulating member are arranged such that a relative dielectric constant of said insulating member progressively increases toward a central part of the container.

11. A plasma processing chamber including a container having a process space for receiving a substrate, and a mounting stage disposed in the container, for mounting the received substrate thereon, the mounting stage being connected to at least one high-frequency power supply, comprising:
- a conductive plate-shaped cooling member that is electrically grounded;
- a plate-shaped electrode that is disposed between said conductive plate-shaped cooling member and the process space and is electrically floating, said plate-shaped electrode having a surface exposed to the process space, said plate-shaped electrode being cooled by said conductive plate-shaped cooling member;
- an insulating member that includes a first insulation member formed of a dielectric material and a second insulation member formed of an anodized aluminum, and that is disposed between said conductive plate-shaped cooling member and said plate-shaped electrode such as not to generate any gap between said conductive plate-shaped cooling member and said insulating member, between said plate-shaped electrode and said insulating member, and between said first insulation member and said second insulation member; and
- a support member that includes an buffer chamber therein and is disposed such as not to generate any gap between said conductive plate-shaped cooling member and said support member,
- wherein said plate-shaped electrode, said insulating member, said conductive plate-shaped cooling member and said support member are superposed in this order to cooperatively compose a showerhead which introduces a gas to the process space, and the showerhead provides a plurality of gas holes that penetrate straight through each of said conductive plate-shaped cooling member, said plate-shaped electrode and said insulating member, respectively, and
- wherein the plurality of gas holes communicate with the buffer chamber of said support member.

12. A plasma processing apparatus comprising a plasma processing chamber including a container having a process space for receiving a substrate, and a mounting stage disposed in the container therein, for mounting the received substrate thereon, the mounting stage being connected to at least one high-frequency power supply, wherein the plasma processing chamber comprises:
- a conductive plate-shaped cooling member that is electrically grounded;
- a plate-shaped electrode that is disposed between said conductive plate-shaped cooling member and the process space and is electrically floating, said plate-shaped electrode having a surface exposed to the process space, said plate-shaped electrode being cooled by said conductive plate-shaped cooling member;
- an insulating member that includes a first insulation member formed of a dielectric material and a second insulation member formed of an anodized aluminum, and that is disposed between said conductive plate-shaped cooling member and said plate-shaped electrode such as not to generate any gap between said conductive plate-shaped cooling member and said insulating member, between said plate-shaped electrode and said insulating member, and between said first insulation member and said second insulation member; and
- a support member that includes an buffer chamber therein and is disposed such as not to generate any gap between said conductive plate-shaped cooling member and said support member,
- wherein said plate-shaped electrode, said insulating member, said conductive plate-shaped cooling member and said support member are superposed in this order to cooperatively compose a showerhead which introduces a gas to the process space, and the showerhead provides a plurality of gas holes that penetrate straight through each of said conductive plate-shaped cooling member, said plate-shaped electrode and said insulating member, respectively, and
- wherein the plurality of gas holes communicate with the buffer chamber of said support member.

* * * * *